United States Patent
Takagi et al.

(10) Patent No.: US 10,074,694 B2
(45) Date of Patent: Sep. 11, 2018

(54) MEMORY DEVICE AND METHOD FOR MANUFACTURING THE SAME

(71) Applicant: Toshiba Memory Corporation, Minato-ku (JP)

(72) Inventors: Takeshi Takagi, Yokkaichi (JP); Takeshi Yamaguchi, Yokkaichi (JP); Masaki Yamato, Yokkaichi (JP); Hiroyuki Ode, Yokkaichi (JP); Toshiharu Tanaka, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/017,899

(22) Filed: Feb. 8, 2016

(65) Prior Publication Data

US 2017/0025475 A1 Jan. 26, 2017

Related U.S. Application Data

(60) Provisional application No. 62/196,677, filed on Jul. 24, 2015.

(51) Int. Cl.
*H01L 27/24* (2006.01)
*H01L 45/00* (2006.01)
*G11C 13/00* (2006.01)

(52) U.S. Cl.
CPC .......... *H01L 27/249* (2013.01); *G11C 13/003* (2013.01); *G11C 13/0007* (2013.01); *H01L 27/2409* (2013.01); *H01L 27/2418* (2013.01); *H01L 27/2454* (2013.01); *H01L 45/1226* (2013.01); *H01L 45/146* (2013.01); *H01L 45/16* (2013.01); *G11C 13/0033* (2013.01); *G11C 2213/32* (2013.01); *G11C 2213/71* (2013.01); *G11C 2213/76* (2013.01);
(Continued)

(58) Field of Classification Search
CPC . H01L 27/249; H01L 45/1226; H01L 45/124; H01L 27/2418; H01L 27/2409; H01L 45/16; H01L 45/146; G11C 13/0002; G11C 13/0007; G11C 13/003; G11C 2213/71; G11C 2213/77
See application file for complete search history.

(56) References Cited

U.S. PATENT DOCUMENTS 8,125,817 B2  2/2012 Takagi et al.
8,441,060 B2  5/2013 Ninomiya et al.
(Continued)

FOREIGN PATENT DOCUMENTS

JP  4633199 B2  11/2010
JP  4956598 B2  6/2012
(Continued)

*Primary Examiner* — Thanhha Pham
(74) *Attorney, Agent, or Firm* — Oblon, McClelland, Maier & Neustadt, L.L.P.

(57) ABSTRACT

According to one embodiment, a memory device includes a first wiring extending in a first direction, a second wiring extending in a second direction crossing the first direction and a resistance change film provided between the first wiring and the second wiring. The second wiring includes a first conductive layer and a first intermediate layer including a first region provided between the first conductive layer and the resistance change film. The first intermediate layer includes a material having nonlinear resistance characteristics.

9 Claims, 12 Drawing Sheets

(52) U.S. Cl.
CPC ...... *G11C 2213/77* (2013.01); *G11C 2213/78* (2013.01); *G11C 2213/79* (2013.01)

(56) References Cited

U.S. PATENT DOCUMENTS

| | | |
|---|---|---|
| 8,907,318 B2 | 12/2014 | Sonehara et al. |
| 2010/0219392 A1 | 9/2010 | Awaya et al. |
| 2011/0309322 A1* | 12/2011 | Hwang .............. G11C 13/0007 257/5 |
| 2012/0147649 A1* | 6/2012 | Samachisa ......... G11C 13/0002 365/51 |
| 2014/0367631 A1 | 12/2014 | Govoreanu |

FOREIGN PATENT DOCUMENTS

| | | |
|---|---|---|
| JP | 5388710 B2 | 1/2014 |
| JP | 2014-36034 A | 2/2014 |
| WO | WO 2010/070895 A1 | 6/2010 |

* cited by examiner

MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/196,677, filed on Jul. 24, 2015; the entire contents of which are incorporated herein by reference.

FIELD

Embodiments are generally related to a memory device and method for manufacturing the same.

BACKGROUND

Recently, a memory device based on resistance change memory has been proposed as a nonvolatile memory device. The electrical resistance of the resistance change memory reversibly transitions between the high-resistance state and the low-resistance state in response to the applied voltage. That is, the resistance change memory records information by a resistance state depending on the applied voltage. Improvement in read disturb immunity is required in such memory devices.

DETAILED DESCRIPTION

According to one embodiment, a memory device includes a first wiring extending in a first direction, a second wiring extending in a second direction crossing the first direction and a resistance change film provided between the first wiring and the second wiring. The second wiring includes a first conductive layer and a first intermediate layer including a first region provided between the first conductive layer and the resistance change film. The first intermediate layer includes a material having nonlinear resistance characteristics.

Embodiments of the invention will now be described with reference to the drawings.

First Embodiment

First, a first embodiment is described.

Figure 1:
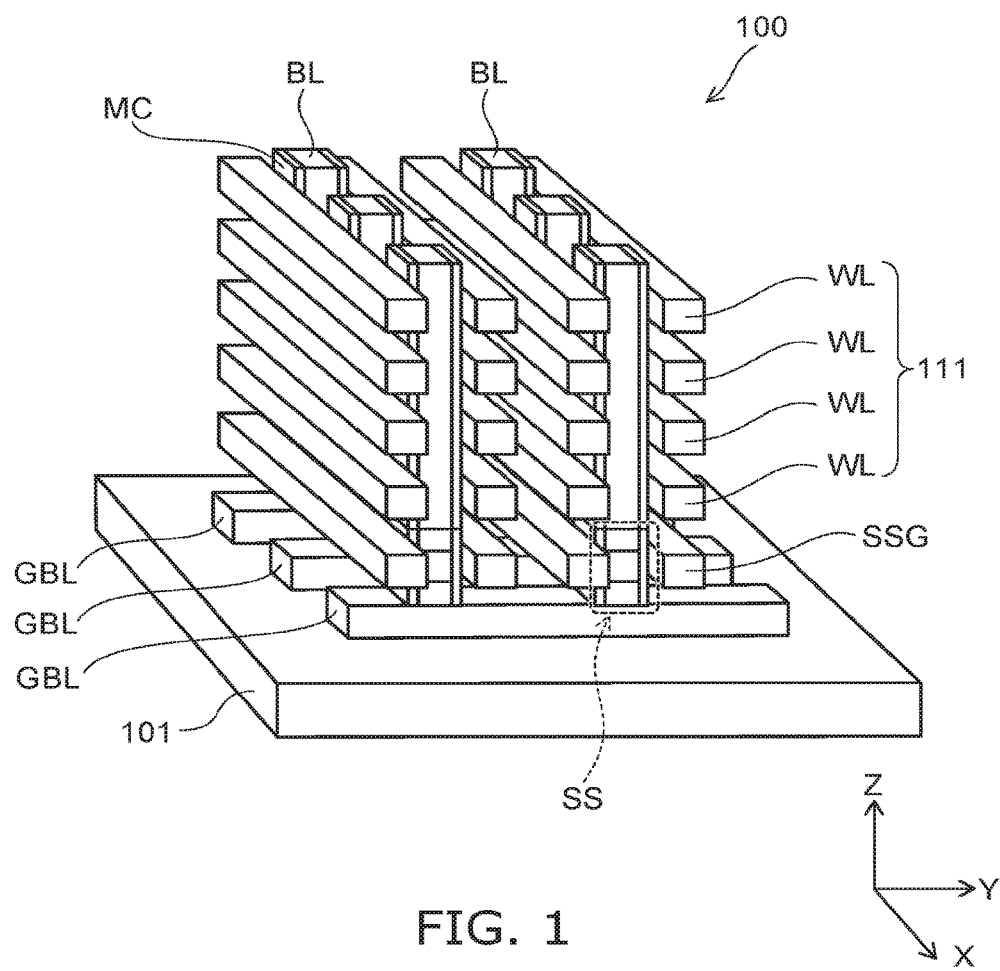
FIG. 1 is a perspective view illustrating a memory device according to a first embodiment.

FIG. 1 is a perspective view illustrating a memory device according to this embodiment.

Figure 2:
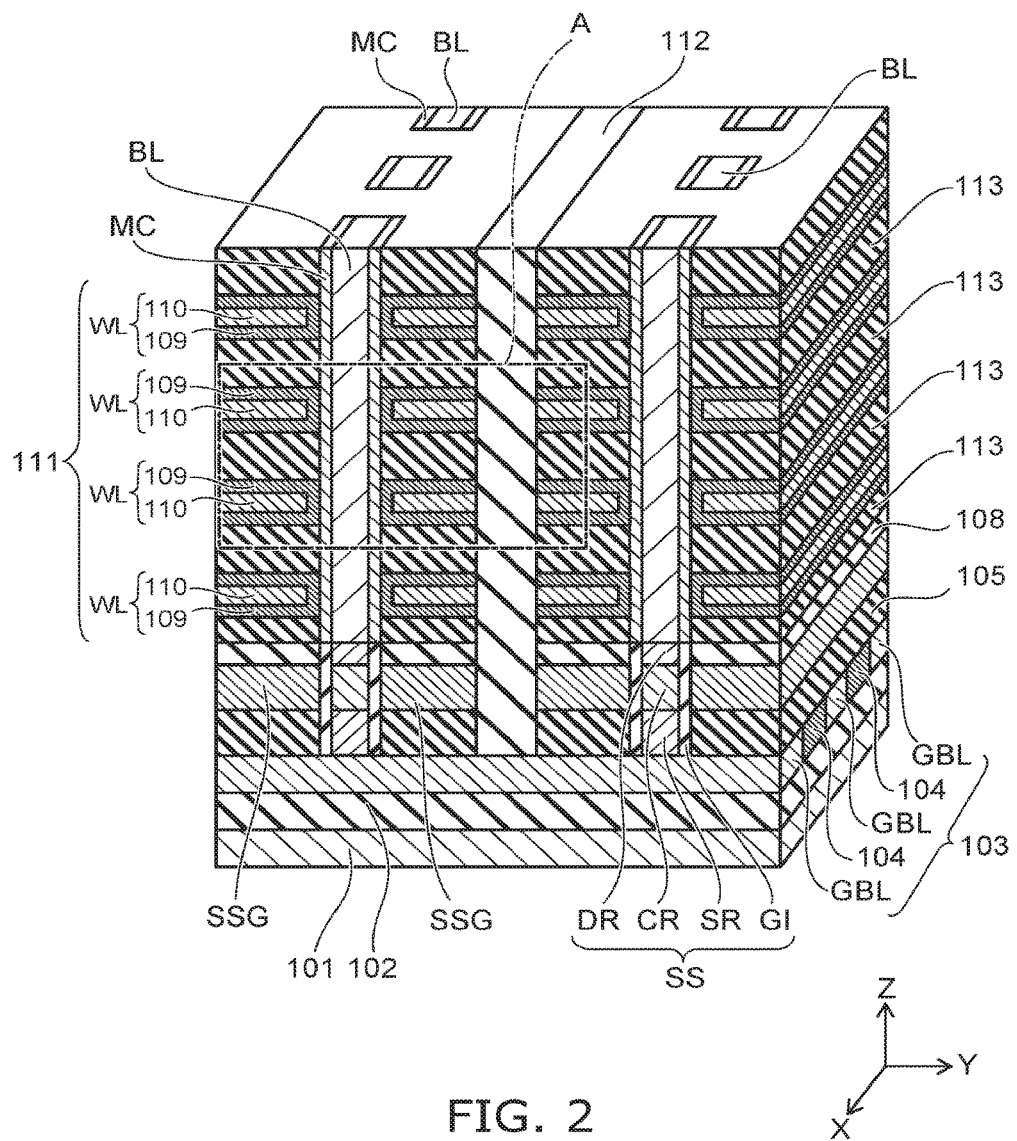
FIG. 2 is a perspective view illustrating the memory device according to the first embodiment.

FIG. 2 is a perspective view illustrating the memory device according to this embodiment.

Figure 3:
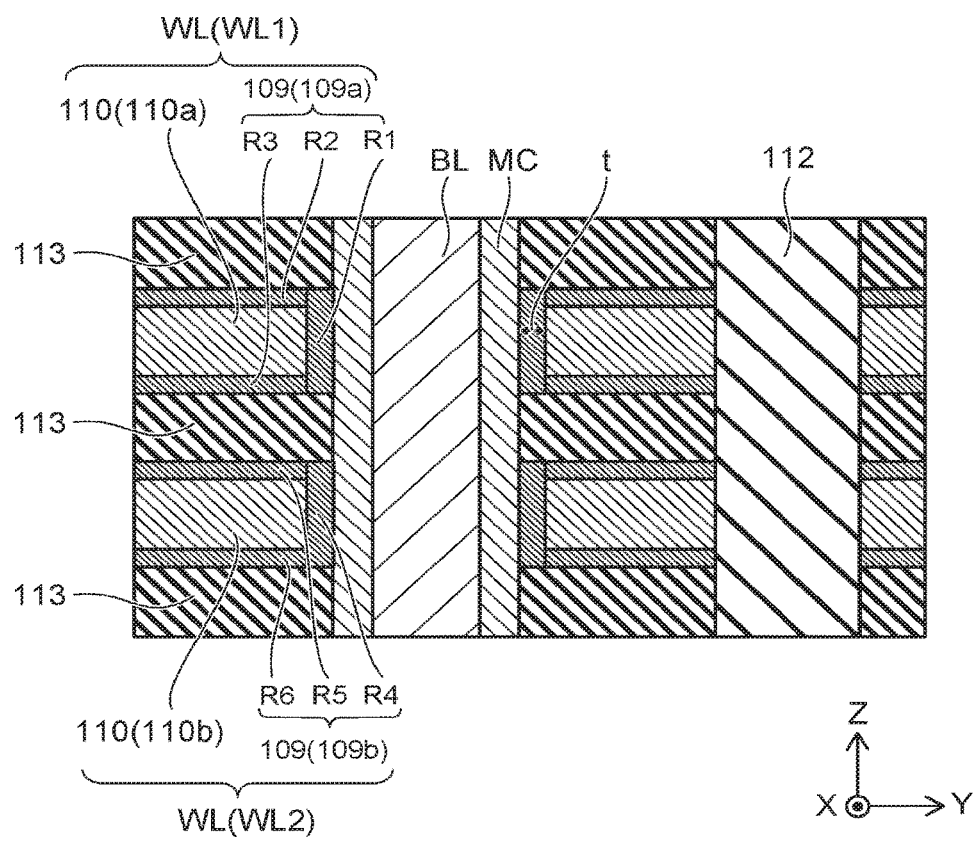
FIG. 3 is an enlarged view of region A shown in FIG. 2.

FIG. 3 is an enlarged view of region A shown in FIG. 2.

In FIG. 1, members other than the substrate 101, global bit line GBL, select member SS, select gate electrode SSG, word line WL, local bit line BL, and resistance change film MC are not shown for simplicity of illustration.

As shown in FIGS. 1 and 2, the memory device 100 according to this embodiment includes a substrate 101.

In the following, for convenience of description, an XYZ orthogonal coordinate system is introduced in this specification. In this coordinate system, two directions parallel to the major surface of the substrate 101 and orthogonal to each other are referred to as "X-direction" and "Y-direction". The direction perpendicular to both the X-direction and the Y-direction is referred to as "Z-direction".

An interlayer insulating film 102 is provided on the substrate 101. A global bit line GBL extending along the Y-direction is provided on the interlayer insulating film 102. The global bit line GBL is provided in a plurality along the X-direction.

An insulating film 104 is embedded between two global bit lines GBL adjacent in the X-direction. The plurality of global bit lines GBL and the insulating film 104 therebetween form a global bit line wiring layer 103.

An insulating film 105 is provided on the global bit line wiring layer 103.

A select gate electrode SSG extending in the X-direction is provided on the insulating film 105.

An insulating film 108 is provided on the select gate electrode SSG.

A select member SS penetrating through the insulating film 108, the select gate electrode SSG, and the insulating film 105 is provided directly above the global bit line GBL. The select member SS is shaped like e.g. a column. The select member SS extends in the Z-direction and is connected to the global bit line GBL. The select member SS includes a source portion SR, a channel portion CR, and a drain portion DR from bottom to top. The select member SS also includes a gate insulating film GI provided between the select gate electrode SSG and the source portion SR, the channel portion CR, and the drain portion DR.

A local bit line BL extending in the Z-direction is provided on the select member SS. The local bit line BL is connected to the global bit line GBL through the select member SS. The local bit line BL is shaped like e.g. a column.

A plurality of word lines WL extending in the X-direction are provided on the side surface of the local bit line BL. The plurality of word lines WL are spaced from each other along the Z-direction. The plurality of word lines WL stacked in the Z-direction form a word line wiring layer 111. A resistance change film MC is provided between the local bit line BL and the word line wiring layer 111. The local bit line BL and the word line WL are connected through the resistance change film MC. As described later in detail, the word line WL includes an intermediate layer 109 and a conductive layer 110.

An insulating member 112 is provided on the side surface of the word line WL on the opposite side from the side surface opposed to the side surface of the local bit line BL. The insulating member 112 is shaped like a plate spread along the X-Z plane.

An insulating film 113 is embedded among the local bit line BL, the resistance change film MC, and the word line WL. The insulating film 113 includes e.g. silicon oxide film.

As shown in FIG. 3, the intermediate layer 109 included in the word line WL covers the upper surface, the lower surface, and the side surface on the local bit line BL side of the conductive layer 110.

In the word line wiring layer 111, the plurality of intermediate layers 109 are electrically isolated from each other.

The plurality of word lines WL forming the word line wiring layer 111 include e.g. a first word line WL1 and a second word line WL2. For instance, the intermediate layer 109 (first intermediate layer 109a) included in the first word line WL1 is not in contact with the intermediate layer 109 (second intermediate layer 109b) included in the second word line WL2.

The intermediate layer 109 (first intermediate layer 109a) included in the first word line WL1 includes a region R1, a region R2, and a region R3. The region R1 is provided between the resistance change film MC and the conductive layer 110 (conductive layer 110a) included in the first word line WL1. In the Z-direction, the region R2 and the region R3 are provided alongside across the conductive layer 110 (conductive layer 110a). That is, the conductive layer 110 (conductive layer 110a) is disposed between the region R2 and the region R3.

The intermediate layer 109 (second intermediate layer 109b) included in the second word line WL2 includes a region R4, a region R5, and a region R6. The region R4 is provided between the resistance change film MC and the conductive layer 110 (conductive layer 110b) included in the second word line WL2. In the Z-direction, the region R5 and the region R6 are provided alongside across the conductive layer 110 (conductive layer 110b). That is, the conductive layer 110 (conductive layer 110b) is disposed between the region R5 and the region R6.

The intermediate layer 109 includes a material having nonlinear resistance characteristics. Thus, the intermediate layer 109 has nonlinear resistance characteristics.

The intermediate layer 109 may include at least one or more materials of titanium oxide, tantalum oxide, and niobium oxide.

The intermediate layer 109 may include e.g. oxygen-deficient metal oxide. For instance, the intermediate layer 109 may include at least one or more materials of oxygen-deficient titanium oxide ($TiO_x$), oxygen-deficient tantalum oxide ($TaO_x$), and oxygen-deficient niobium oxide ($NbO_x$). The oxygen content of oxygen-deficient metal oxide is lower than the composition of the metal oxide having the stoichiometric composition.

The intermediate layer 109 may include e.g. silicon nitride.

The resistance change film MC includes a resistance change material. The resistance change material is e.g. a metal oxide such as hafnium oxide.

The bandgap of the major material included in the intermediate layer 109 is smaller than the bandgap of the major material included in the resistance change film MC.

The thickness t in the Y-direction of the intermediate layer 109 is preferably 1 nm or more and 5 nm or less. The thickness t of the intermediate layer 109 refers to e.g. the thickness between the conductive layer 110 and the resistance change film MC.

The select gate electrode SSG and the conductive layer 110 include a conductive material such as tungsten (W).

Next, a method for manufacturing the memory device 100 according to this embodiment is described.

FIGS. 4 to 8 are perspective views illustrating the method for manufacturing the memory device according to this embodiment.

FIGS. 9 to 14 are process sectional views illustrating the method for manufacturing the memory device according to this embodiment.

Figure 8:
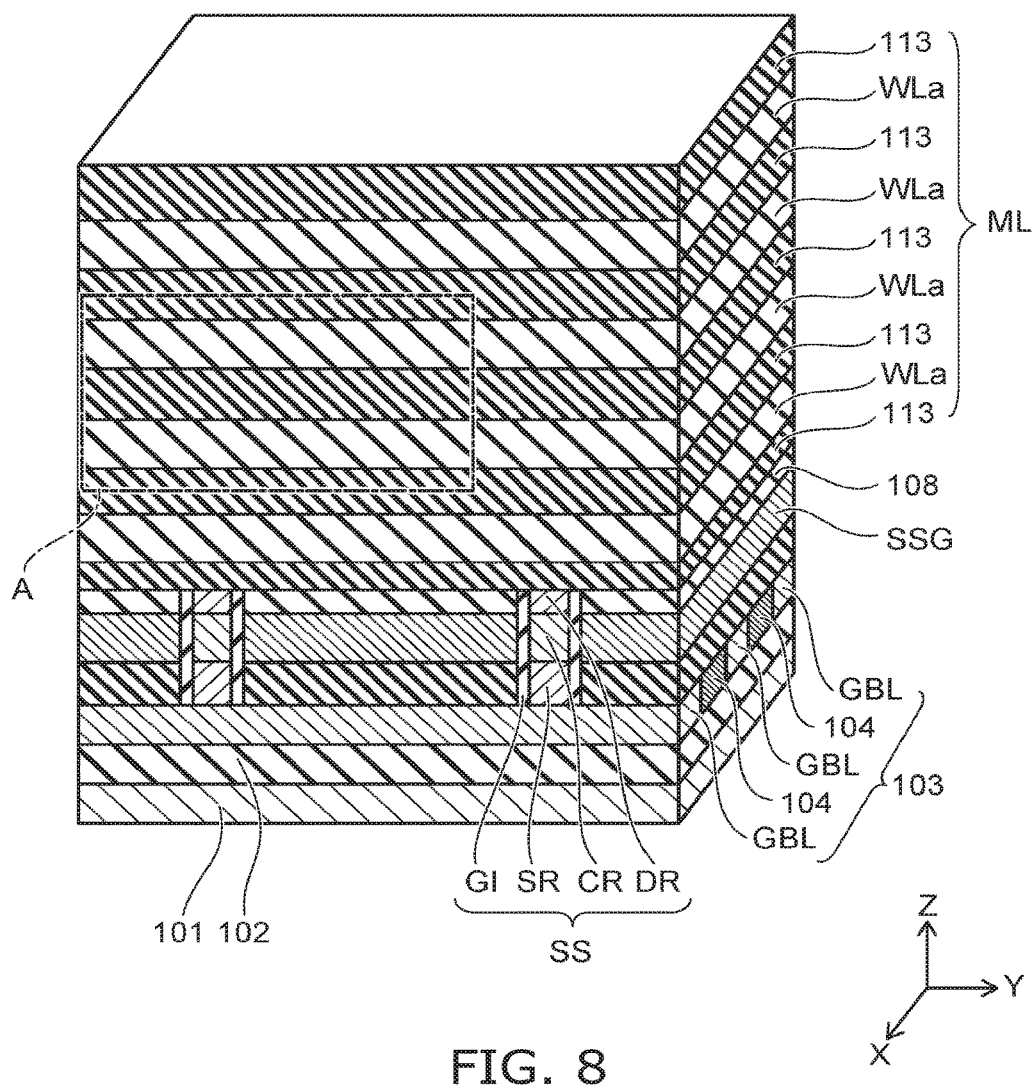

FIGS. 9 to 14 show a region corresponding to region A shown in FIG. 8.

Figure 4:
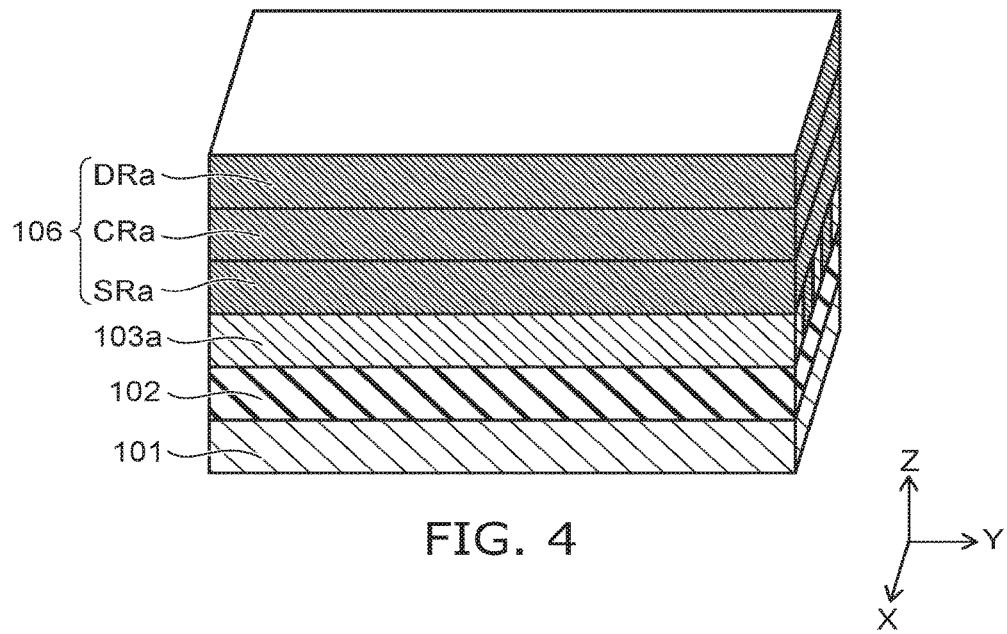
FIGS. 4 to 8 are perspective views illustrating the method for manufacturing the memory device according to the first embodiment.

First, as shown in FIG. 4, an interlayer insulating film 102 is formed on a substrate 101. A conductive film 103a is formed on the interlayer insulating film 102.

A first silicon layer SRa, a second silicon layer CRa, and a third silicon layer DRa are stacked in this order on the conductive film 103a. Thus, a stacked film 106 is formed. For instance, the first silicon layer SRa is an $n^+$-type silicon layer. The second silicon layer CRa is a $p^-$-type silicon layer. The third silicon layer DRa is an $n^+$-type silicon layer.

Figure 5:
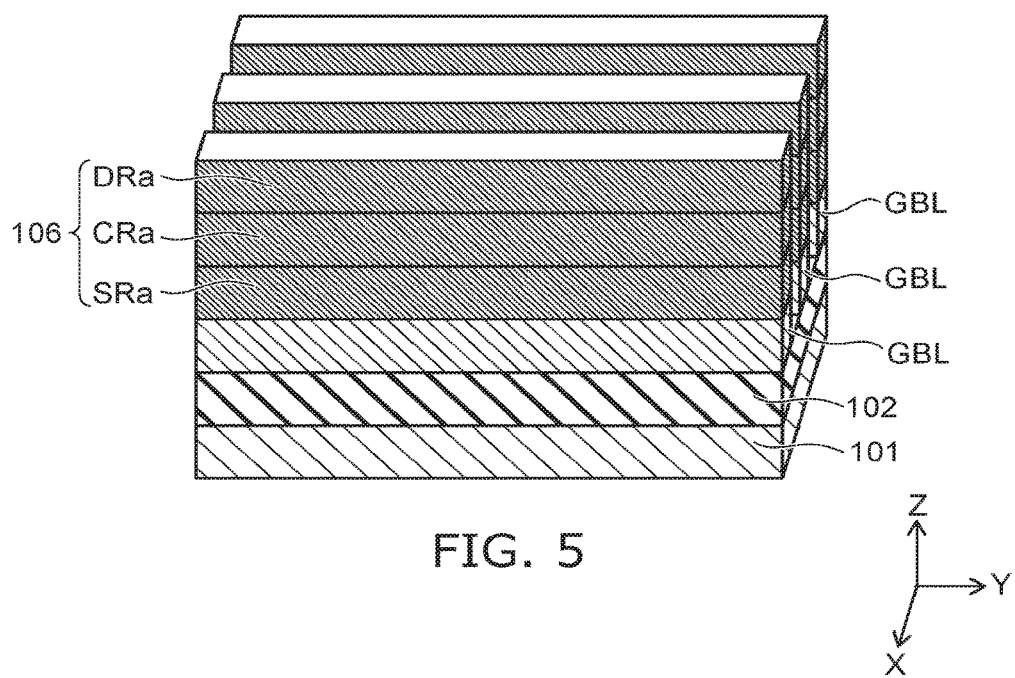

Next, as shown in FIG. 5, the conductive film 103a and the stacked film 106 are patterned by a processing technique such as photolithography. Thus, the conductive film 103a is processed into a plurality of global bit lines GBL extending in the Y-direction. The global bit lines GBL are spaced from each other along the X-direction. At this time, the stacked film 106 is also processed into stripes along the Y-direction.

Figure 6:
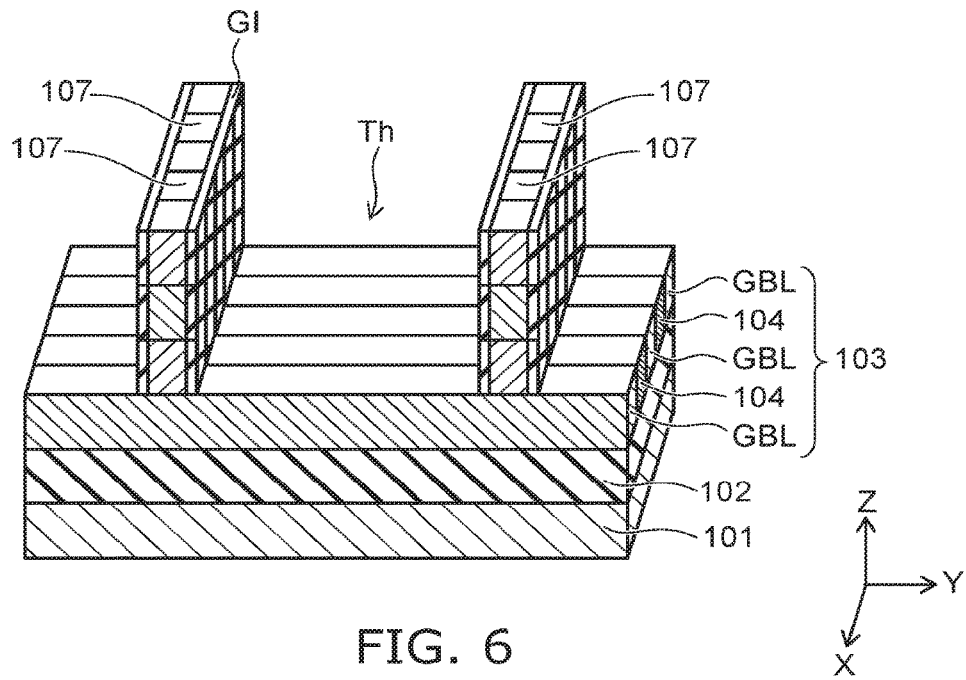

Next, as shown in FIG. 6, an insulating material is deposited on the entire surface. Then, the upper surface of the third silicon layer DRa of the stacked film 106 is exposed by planarization treatment such as CMP (chemical mechanical polishing).

Thus, an insulating layer 104 is formed between the global bit lines GBL. As a result, a global bit line wiring layer 103 including the global bit lines GBL and the insulating film 104 is formed. At this time, an insulating film 107 is also formed between the stacked films 106 processed into stripes.

Then, the stacked film 106 and the insulating film 107 are patterned into stripes along the X-direction by a processing technique such as photolithography. At this time, the upper surface of the global bit line GBL and the upper surface of the insulating film 104 are exposed at the bottom of the formed trench part Th.

By the aforementioned two iterations of patterning, the stacked film 106 is divided along the X-direction and the Y-direction. Thus, the stacked film 106 is processed into a plurality of columnar bodies. In each columnar body, the first silicon layer SRa constitutes a source portion SR. The second silicon layer CRa constitutes a channel portion CR. The third silicon layer DRa constitutes a drain portion DR.

Then, an insulating film is formed on the entire surface. Then, by etch-back, the insulating film is left only on the side surface of the trench part Th. Thus, a gate insulating film GI is formed on the side surface of the trench part Th. Accordingly, a select member SS is formed from the gate insulating film GI and the columnar part including the source portion SR, the channel portion CR, and the drain portion DR.

Figure 7:
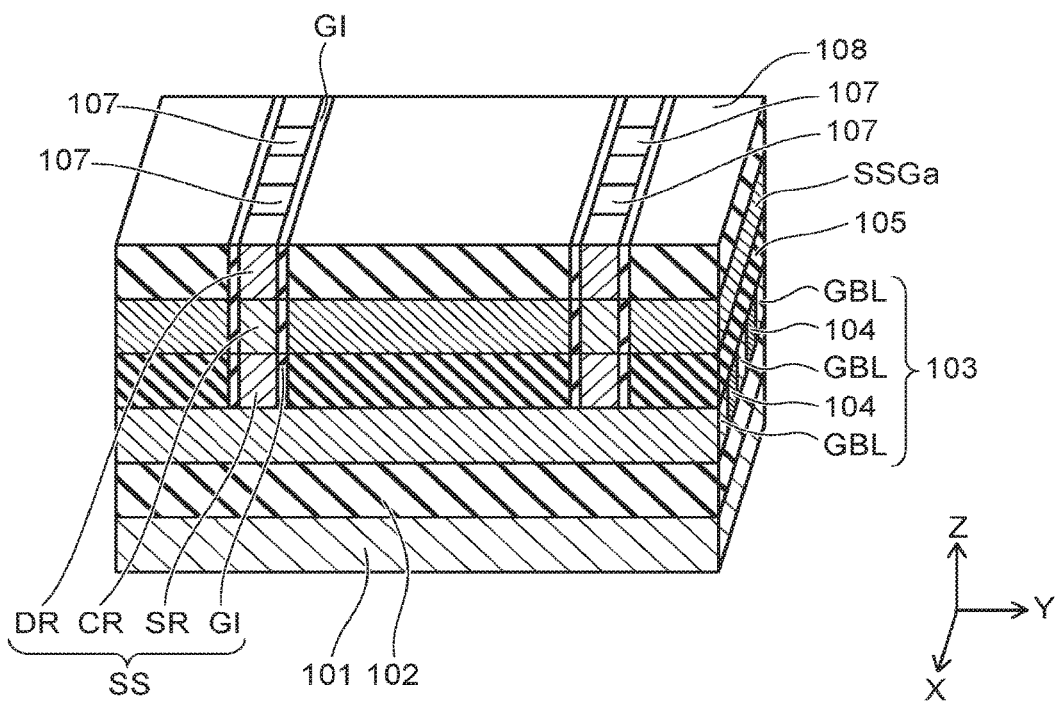

Next, as shown in FIG. 7, an insulating material is deposited on the entire surface, and then subjected to etching treatment. Thus, an insulating film 105 is formed at the bottom of the trench part Th. At this time, the upper surface of the insulating film 105 is formed nearly at the same position in the Z-direction as the interface between the source portion SR and the channel portion CR.

Next, a conductive material is deposited on the entire surface, and then subjected to etching treatment. Thus, a select gate electrode SSG is formed on the insulating layer 105. The upper surface of the select gate electrode SSG is formed nearly at the same position in the Z-direction as the interface between the channel portion CR and the drain portion DR.

Next, an insulating material is deposited on the entire surface, and then subjected to etching treatment. Thus, an insulating film 108 is formed on the select gate electrode SSG. The upper surface of the insulating film 108 is formed nearly at the same position in the Z-direction as the upper surface of the drain portion DR.

Next, as shown in FIG. 8, insulating films 113 and sacrificial films WLa (first films) are alternately stacked on the insulating film 108. Thus, a stacked body ML including a plurality of insulating films 113 and a plurality of sacrificial films WLa is formed on the insulating film 108. The insulating film 113 is formed from a material including silicon oxide. The sacrificial film WLa is formed from a material including silicon nitride.

Figure 9:
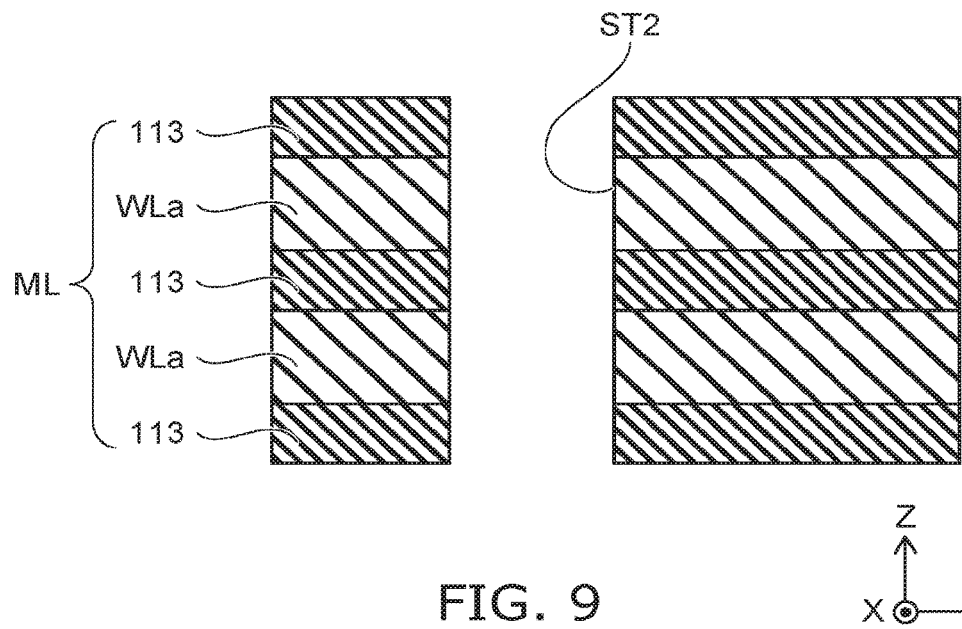
FIGS. 9 to 14 are process sectional views illustrating the method for manufacturing the memory device according to the first embodiment.

Next, as shown in FIG. 9, a slit ST2 (first slit) is formed directly above the select member SS. Although not shown, the slit ST2 is extended to the upper surface of the select member SS. The slit ST2 is shaped like a trench spread along the X-Z plane.

Figure 10:
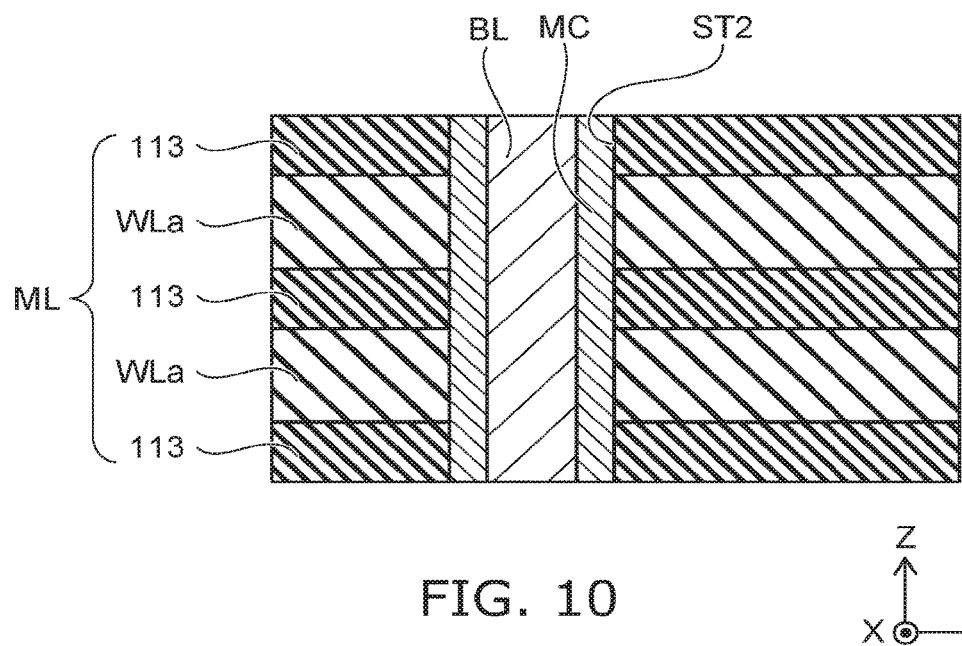

Next, as shown in FIG. 10, a resistance change material such as hafnium oxide is deposited on the entire surface. Then, etch-back treatment is performed to remove the resistance change material deposited on the stacked body ML and the bottom of the slit ST2. The resistance change material is left on the inner side surface of the slit ST2. Thus, the resistance change material left on the inner side surface of the slit ST2 constitutes a resistance change film MC. Next, a conductive material such as polysilicon is embedded in the slit ST2 to form a local bit line BL. The local bit line BL is connected to the select member SS. At this time, the local bit line BL is shaped like a plate spread along the X-Z plane. The local bit line BL is connected to a plurality of global bit lines GBL through a plurality of select members SS.

Next, the local bit line BL directly above the insulating film 104 is selectively removed by anisotropic etching such as RIE (reactive ion etching) to form a columnar recess. Thus, the local bit line BL shaped like a plate spread along the X-Z plane is divided and processed into columns. By this processing, one local bit line BL is connected to one global bit line GBL through one select member SS. Next, the columnar recess is embedded with an insulating material including silicon oxide. This insulating material constitutes part of the insulating film 113.

Figure 11:
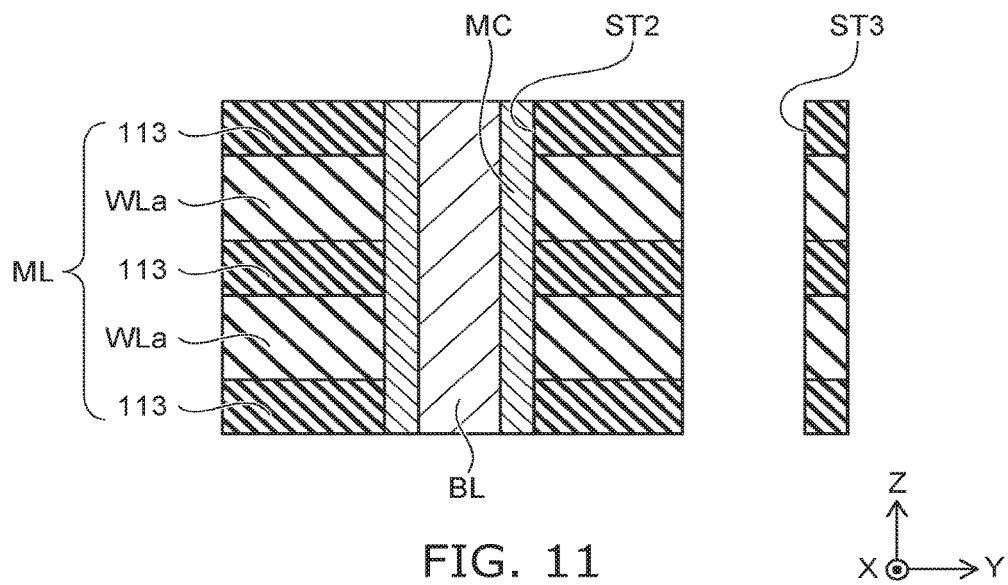

Next, as shown in FIG. 11, a slit ST3 (second slit) penetrating through the stacked body ML, the insulating film 108, the select gate electrode SSG, and the insulating film 105 is formed at a position different from the position where the slit ST2 of the stacked body ML is formed. The slit ST3 is shaped like a trench spread along the X-Z plane.

Figure 12:
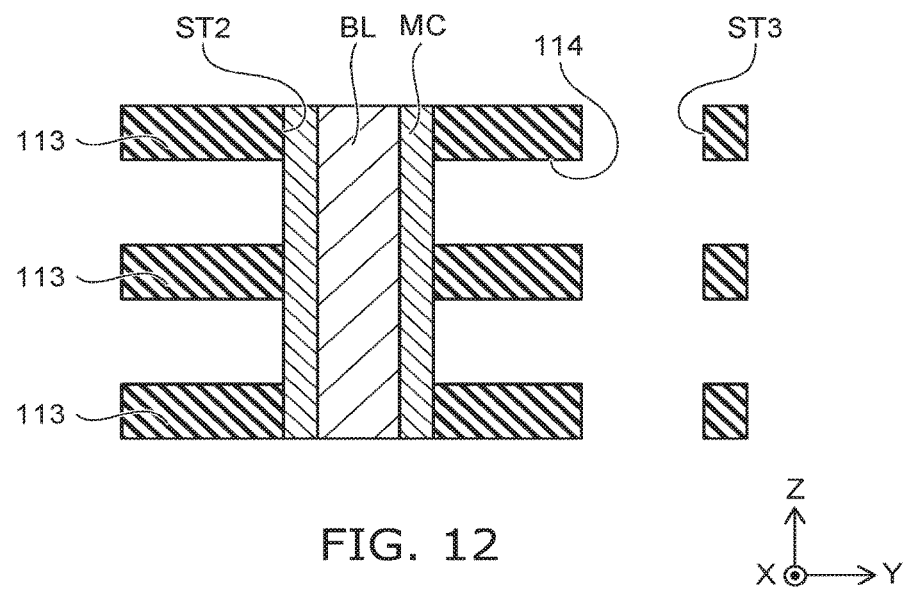

Next, as shown in FIG. 12, the sacrificial film WLa is removed by wet etching with a chemical solution such as hot phosphoric acid through the slit ST3. Thus, a recess 114 is formed in the region formed by the removal of the sacrificial film WLa.

Figure 13:
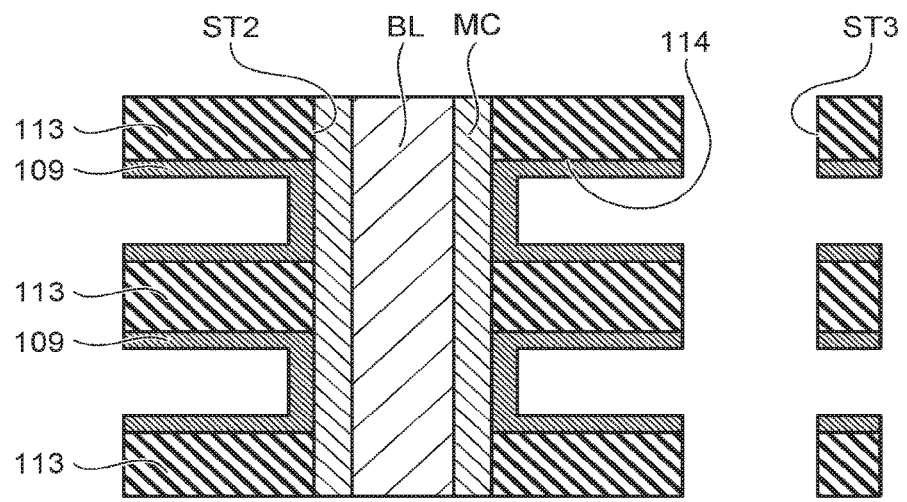

Next, as shown in FIG. 13, an intermediate layer 109 is formed on the inner surface of the recess 114 through the slit ST3.

The intermediate layer 109 is formed from a material having nonlinear resistance characteristics.

The intermediate layer 109 may be formed from e.g. at least one or more materials of titanium oxide, tantalum oxide, and niobium oxide. The intermediate layer 109 may be formed from silicon nitride.

The intermediate layer 109 may be formed from e.g. at least one or more materials of oxygen-deficient titanium oxide ($TiO_x$), oxygen-deficient tantalum oxide ($TaO_x$), and oxygen-deficient niobium oxide ($NbO_x$).

Figure 14:
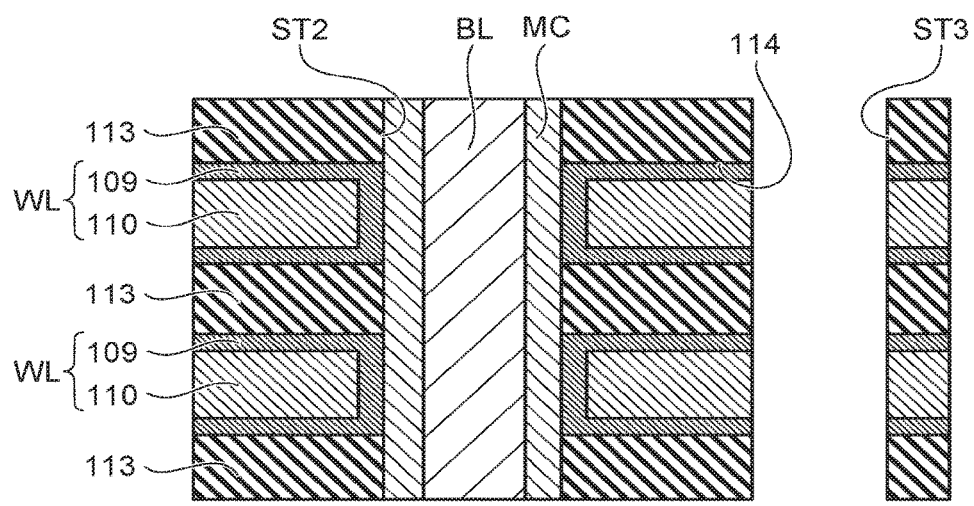

Next, as shown in FIG. 14, a conductive material such as tungsten is deposited in the recess 114 through the slit ST3 to form a conductive layer 110. Thus, a word line WL including the intermediate layer 109 and the conductive layer 110 is formed in the recess 114.

The memory device 100 according to this embodiment is manufactured by the above process.

Next, the effect of this embodiment is described.

When information is read from a memory device including a resistance change film by selecting a particular local bit line and a particular word line, a read potential is applied to the particular local bit line. No potential is applied to the particular word line. Thus, a read voltage is applied between the particular local bit line and the particular word line.

At this time, a half-select potential lower than the read potential is applied to the other local bit lines and the other word lines. A half-select voltage is applied between the particular local bit line and the other word lines connected to the particular local bit line.

In this embodiment, the word line WL includes an intermediate layer 109. The intermediate layer 109 exhibits nonlinear resistance characteristics.

The intermediate layer 109 applied with the read voltage takes a low resistance value. On the other hand, the intermediate layer 109 applied with the half-select voltage takes a higher resistance value than that applied with the read voltage.

The difference between the resistance value under application of the read voltage and the resistance value under application of the half-select voltage in the intermediate layer 109 is larger than the difference between the resistance value under application of the read voltage and the resistance value under application of the half-select voltage in a layer with linearly changing resistance value. That is, the intermediate layer 109 acts as a rectifying element between the local bit line BL and the conductive layer 110.

Thus, when the read voltage is applied between a particular word line WL and a particular local bit line BL, the information recorded in the resistance change film MC is read without being hampered by the intermediate layer 109. On the other hand, the intermediate layer 109 applied with the half-select voltage forms a potential barrier between the resistance change film MC and the conductive layer 110.

That is, the potential barrier effect of the intermediate layer 109 suppresses the influence of the applied half-select voltage on the resistance change film MC. This improves the read disturb immunity of the memory device 100.

Furthermore, the intermediate layers 109 included in a plurality of word lines WL are electrically isolated from each other. That is, rectifying elements electrically isolated between the word lines WL are integrated. This suppresses current flow resulting from the potential difference between the word lines WL applied with different voltages. Thus, the disturb between the word lines WL can be suppressed.

Furthermore, the spacing between the word lines WL may be narrowed to miniaturize the memory device. In this case, the disturb between the word lines WL is made more likely to occur. However, in this embodiment, even if the spacing between the word lines WL is narrowed, the disturb between the word lines WL can be suppressed because each word line WL includes an intermediate layer 109.

Furthermore, in a memory device including a resistance change film, the resistance state of the resistance change film reversibly changes between the low-resistance state and the high-resistance state in response to the applied voltage.

For instance, when the resistance change film is in the high-resistance state, a prescribed first voltage is applied.

This changes the resistance state of the resistance change film from the high-resistance state to the low-resistance state. This operation is referred to as set operation. The set operation is e.g. a write operation.

In the operation for returning the low-resistance state to the high-resistance state, for instance, the resistance change film is applied with a second voltage opposite in polarity to that of the set operation. This changes the resistance state of the resistance change film from the low-resistance state to the high-resistance state. This operation is referred to as reset operation. The reset operation is e.g. an erase operation.

The memory device records information by such a switching operation for causing the resistance state of the resistance change film to transition between the low-resistance state and the high-resistance state.

However, the resistance value of the resistance change film is still higher than that of the high-resistance state immediately after the resistance change film is formed. Thus, the forming treatment is applied to change the resistance change film to the state of being operable as a memory, i.e., the state of being capable of switching operation.

In general, the forming treatment is performed by applying a prescribed voltage to the resistance change film. The amplitude of the voltage pulse used for the forming treatment is larger than the amplitude of the voltage pulse used for the switching operation. The pulse width of the voltage pulse used for the forming treatment is longer than the pulse width of the voltage pulse used for the switching operation.

This embodiment can achieve the effect of extracting oxygen from the resistance change film MC by the intermediate layer 109. That is, the intermediate layer 109 can extract oxygen atoms from the metal oxide included in the resistance change film MC. This oxygen extraction effect of the intermediate layer 109 forms a low oxygen region in the resistance change film MC. Thus, the resistance of the resistance change film MC can be decreased. Accordingly, reduction of the voltage required for the forming treatment can be expected.

Furthermore, the intermediate layer 109 provided between the resistance change film MC and the conductive layer 110 also functions as an adhesive layer. This can improve the adhesiveness between the members.

The manufacturing of the memory device 100 according to this embodiment can share the process with the manufacturing of a three-dimensionally stacked semiconductor memory device. More specifically, the latter semiconductor memory device includes a stacked body in which conductive films and insulating films are alternately stacked. A memory cell is disposed at each intersection point of a semiconductor pillar penetrating through the stacked body. This embodiment can utilize the manufacturing facility of the latter semiconductor memory device.

Furthermore, the memory device 100 has a simple structure in which the intermediate layer 109 is provided on the upper surface, on the lower surface, and on the side surface on the local bit line BL side of the conductive layer 110. Thus, the memory device 100 is easy to manufacture.

Second Embodiment

Next, a memory device according to a second embodiment is described.

Figure 15:
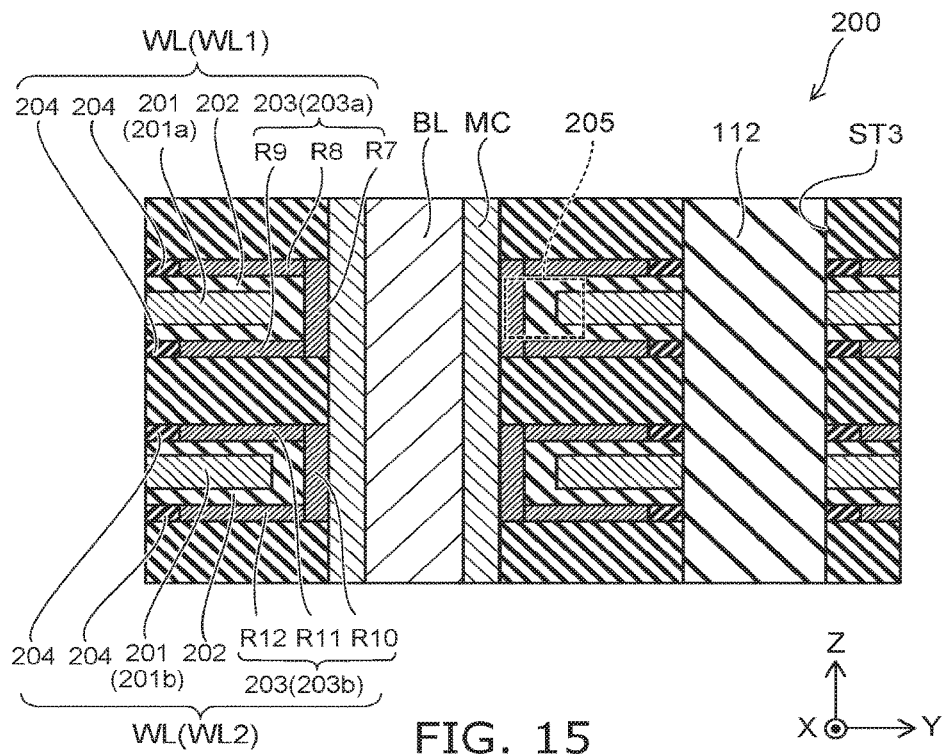
FIG. 15 is a sectional view illustrating the memory device according to a second embodiment.

FIG. 15 is a sectional view illustrating the memory device according to the second embodiment.

FIG. 15 shows a region corresponding to region A shown in FIG. 2.

As shown in FIG. 15, in the memory device 200 according to this embodiment, each of a plurality of word lines WL includes a conductive layer 201, an insulating layer 202, a conductive film 203, and an insulating layer 204 (second insulating layer). The conductive layer 201 is shaped like a plate spread along the X-Y plane. The conductive film 203 is disposed on the upper surface, on the lower surface, and on the side surface on the local bit line BL side of the conductive layer 201. The insulating layer 204 is provided on the side surface of the conductive film 203 on the opposite side from the side surface on the local bit line BL side. For instance, the insulating layer 204 is disposed between the conductive film 203 and the insulating member 112. The insulating layer 202 is disposed between the conductive layer 201 and the conductive film 203 and between the conductive layer 201 and the insulating layer 204.

Thus, a MIM (metal insulator metal) rectifying part 205 is formed in part of each of the plurality of word lines WL. The MIM rectifying parts 205 included in the plurality of word lines WL are electrically isolated from each other.

The plurality of word lines WL include e.g. a first word line WL1 and a second word line WL2.

The conductive film 203 (first conductive film 203a) included in the first word line WL1 is not in contact with the conductive film 203 (second conductive film 203b) included in the second word line WL2.

The conductive film 203 (first conductive film 203a) included in the first word line WL1 includes a region R7, an region R8, and a region R9. The region R7 is provided between the resistance change film MC and the conductive layer 201 (conductive layer 201a) included in the first word line WL1. In the Z-direction, the region R8 and the region R9 are provided alongside across the conductive film 203 (conductive film 203a). That is, the conductive layer 201 (conductive layer 201a) is disposed between the region R8 and the region R9.

The conductive film 203 (second conductive film 203b) included in the second word line WL2 includes a region R10, an region R11, and a region R12. The region R10 is provided between the resistance change film MC and the conductive layer 201 (conductive layer 201b) included in the second word line WL2. In the Z-direction, the region R11 and the region R12 are provided alongside across the conductive film 203 (conductive film 201b). That is, the conductive layer 201 (conductive layer 201b) is disposed between the region R11 and the region R12.

The conductive layer 201 and the conductive film 203 include a conductive material such as titanium nitride. The insulating layer 202 includes an insulating material such as silicon oxide and silicon nitride. Furthermore, the insulating layer 204 includes an insulating material such as titanium oxynitride and titanium oxide.

The configuration other than the configuration of the word line WL is similar to that of the first embodiment.

Next, a method for manufacturing the memory device according to this embodiment is described.

FIGS. 16 to 19 are process sectional views illustrating the method for manufacturing the memory device according to this embodiment.

FIGS. 16 to 19 show a region corresponding to region A shown in FIG. 8.

First, the process shown in FIGS. 4 to 12 is performed as in the first embodiment.

Figure 16:
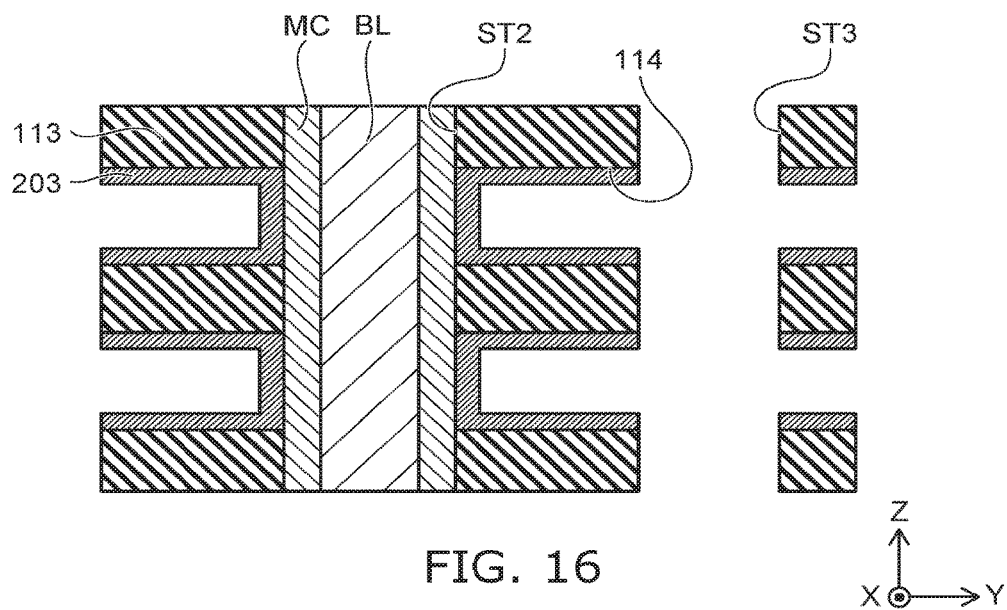
FIGS. 16 to 19 are process sectional views illustrating the method for manufacturing the memory device according to the second embodiment.

Next, as shown in FIG. 16, a conductive material such as titanium nitride is deposited through the slit ST3 to form a conductive film 203 on the inner surface of the recess 114.

The conductive material deposited on the side surface of the slit ST3 is removed by etch-back treatment.

Figure 17:
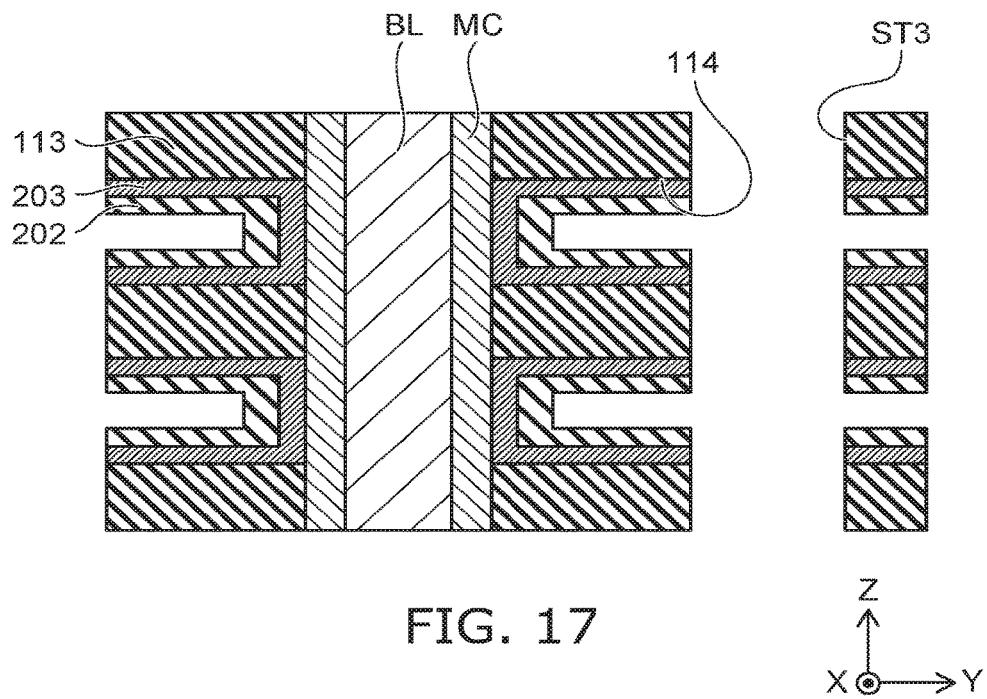

Next, as shown in FIG. 17, an insulating material such as silicon oxide and silicon nitride is deposited on the conductive film 203 through the slit ST3 to form an insulating layer 202. Then, the insulating material deposited on the side surface of the slit ST3 is removed by etch-back treatment. Thus, the side surface on the slit ST3 side of the conductive film 203 is exposed.

Figure 18:
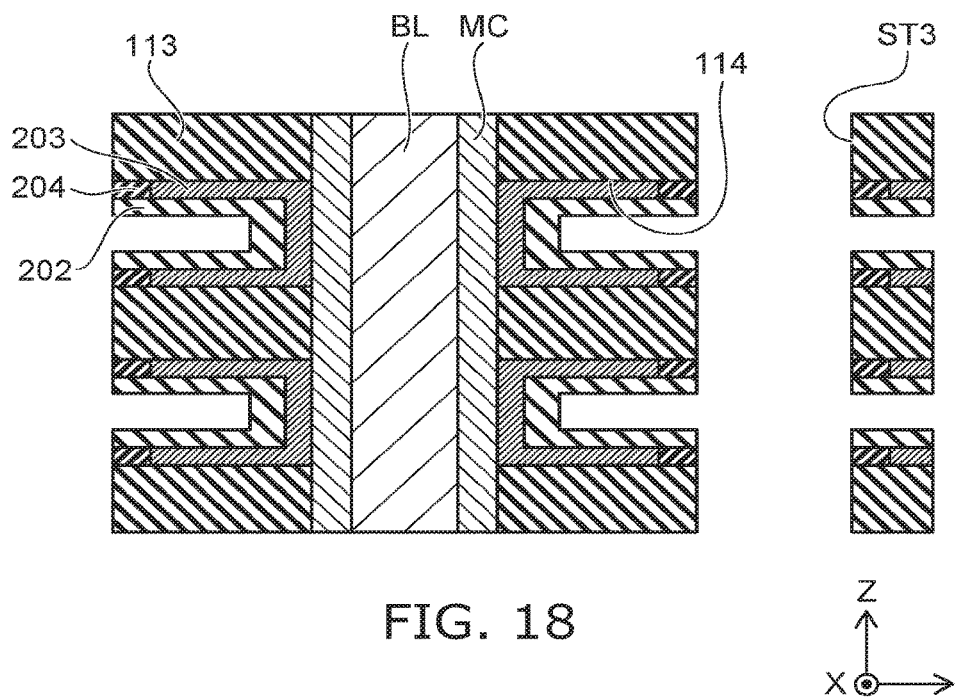

Next, as shown in FIG. 18, oxidation treatment is performed through the slit ST3 to oxidize the end part on the slit ST3 side of the conductive film 203. Thus, the end part of the conductive film 203 is turned to an insulating layer 204 including an insulating material such as titanium oxynitride and titanium oxide.

Figure 19:
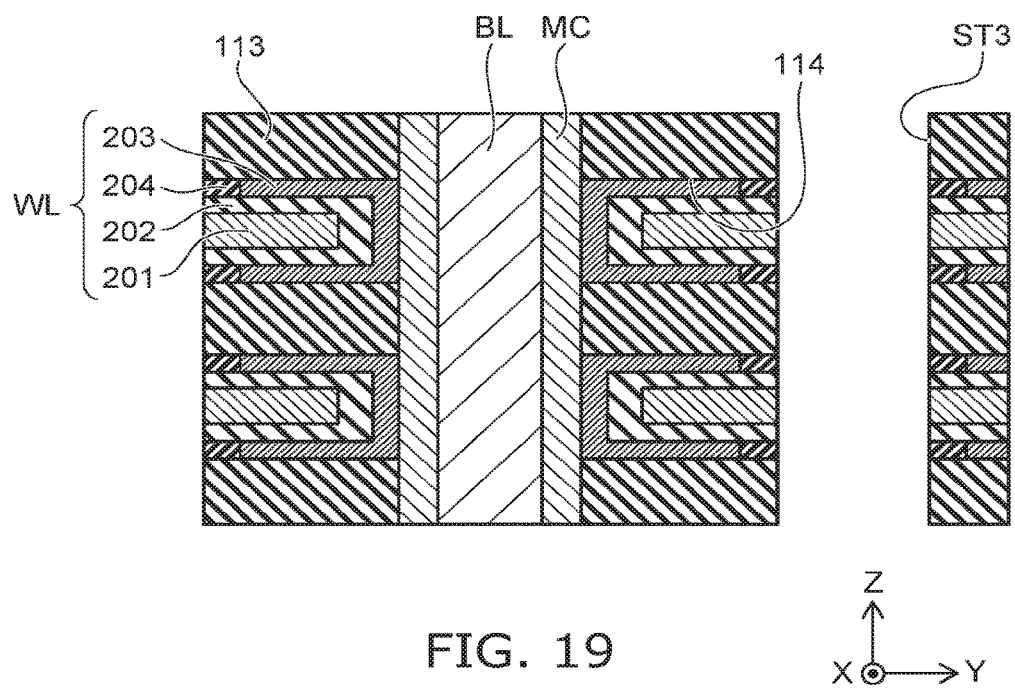

Next, as shown in FIG. 19, the recess 114 is embedded with a conductive material such as titanium nitride through the slit ST3 to form a conductive layer 201. Thus, a word line WL including the conductive layer 201, the conductive film 203, and the insulating layers 202 and 204 is formed in the recess 114.

Next, as shown in FIG. 15, an insulating material is embedded in the slit ST3. Thus, an insulating member 112 is formed in the slit ST3.

The memory device 200 according to this embodiment is manufactured by the above process.

Next, the effect of this embodiment is described.

In this embodiment, the MIM rectifying part 205 is formed in part of the word line WL. The MIM rectifying part 205 exhibits nonlinear resistance characteristics. That is, the MIM rectifying part 205 functions as a rectifying element.

More specifically, the MIM rectifying part 205 applied with the read voltage takes a low resistance value. On the other hand, the MIM rectifying part 205 applied with the half-select voltage takes a higher resistance value than that applied with the read voltage.

Thus, the MIM rectifying part 205 can suppress the influence of the applied half-select voltage on the resistance change film MC. This improves the read disturb immunity.

Furthermore, the MIM rectifying parts 205 of the word lines WL are electrically isolated from each other. That is, rectifying elements electrically isolated between the word lines WL are integrated. This suppresses current flow resulting from the potential difference between the word lines WL applied with different voltages. Thus, the disturb between the word lines WL can be suppressed.

Furthermore, even if the spacing between the word lines WL is narrowed, the disturb between the word lines WL can be suppressed because each word line WL includes a MIM rectifying part 205.

Furthermore, as in the first embodiment, the manufacturing of the memory device 200 according to this embodiment can share the process with the manufacturing of a three-dimensionally stacked semiconductor memory device.

Furthermore, the insulating layer 204 is provided. This can suppress short circuit between the conductive layer 201 and the conductive film 203 in the end part of the word line WL.

The embodiments described above can realize a memory device having high read disturb immunity and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device comprising:
a first wiring extending in a first direction;
a second wiring extending in a second direction crossing the first direction; and
along a third direction perpendicular to the first direction and the second direction, a resistance change film provided between the first wiring and the second wiring,
the second wiring including:
a first conductive layer extending in the second direction;
along the third direction, a first conductive film including a first region provided between the first conductive layer and the resistance change film, the first conductive film extending in the second direction; and
along the third direction, a first insulating layer provided between the first conductive layer and the first conductive film.

2. The device according to claim 1, wherein
the first conductive film further includes:
an second region; and
a third region, and
the first conductive layer is disposed between the second region and the third region in the first direction.

3. The device according to claim 2, further comprising:
an insulating member; and
a second insulating layer,
the second wiring being disposed between the first wiring and the insulating member, and
the second insulating layer being disposed between the first conductive film and the insulating member.

4. The device according to claim 1, further comprising:
a third wiring arranged with the second wiring in the first direction and extending in the second direction,
the third wiring including:
a second conductive layer;
a second conductive film including a fourth region provided between the second conductive layer and the resistance change film; and
a third insulating layer provided between the second conductive layer and the second conductive film, and
the first conductive film and the second conductive film being not in contact with each other.

5. The device according to claim 4, wherein
the second conductive film further includes:
a fifth region; and
a sixth region, and
the second conductive layer is disposed between the fifth region and the sixth region in the first direction.

6. The device according to claim 4, further comprising:
an insulating film provided between the second wiring and the third wiring.

7. The device according to claim 1, further comprising:
a fourth wiring extending in the third direction, a part of a side surface of the fourth wiring being electrically connected with an end part of the first wiring.

8. The device according to claim 7, further comprising:
a select member provided between the fourth wiring and the first wiring, the fourth wiring being electrically connected with the first wiring through the select member.

9. A memory device comprising:
a first wiring extending in a first direction;
a second wiring extending in a second direction crossing the first direction;
a resistance change film provided between the first wiring and the second wiring,
the second wiring including:
   a first conductive layer extending in the second direction;
   a first conductive film including a first region provided between the first conductive layer and the resistance change film, the first conductive film extending in the second direction, the first conductive film surrounding a top surface, a side surface and a bottom surface of the first conductive layer;
   a first insulating layer provided between the first conductive layer and the first conductive film.

* * * * *